United States Patent
Fishman

(10) Patent No.: US 8,242,420 B2
(45) Date of Patent: Aug. 14, 2012

(54) DIRECTIONAL SOLIDIFICATION OF SILICON BY ELECTRIC INDUCTION SUSCEPTOR HEATING IN A CONTROLLED ENVIRONMENT

(75) Inventor: Oleg S. Fishman, Maple Glen, PA (US)

(73) Assignee: Inductotherm Corp., Rancocas, NJ (US)

(*) Notice: Subject to any disclaimer, the term of this patent is extended or adjusted under 35 U.S.C. 154(b) by 533 days.

(21) Appl. No.: 12/550,097

(22) Filed: Aug. 28, 2009

(65) Prior Publication Data

US 2010/0051609 A1    Mar. 4, 2010

Related U.S. Application Data

(60) Provisional application No. 60/093,347, filed on Aug. 31, 2008.

(51) Int. Cl.
*H05B 6/10* (2006.01)
(52) U.S. Cl. ............ 219/634; 219/632; 117/81; 117/83; 117/223
(58) Field of Classification Search .................. 219/634, 219/635, 632, 638, 618; 117/81, 83, 223
See application file for complete search history.

(56) References Cited

U.S. PATENT DOCUMENTS

| | | | |
|---|---|---|---|
| 4,243,471 A | 1/1981 | Ciszek et al. | |
| 5,012,060 A * | 4/1991 | Gerard et al. | 219/631 |
| 6,592,663 B1 * | 7/2003 | Sarayama et al. | 117/68 |
| 7,704,324 B2 * | 4/2010 | D'Evelyn et al. | 117/200 |
| 2008/0178793 A1 | 7/2008 | Heuer et al. | |
| 2008/0196209 A1 | 8/2008 | Friestad | |
| 2012/0074121 A1 * | 3/2012 | Gagas et al. | 219/385 |

OTHER PUBLICATIONS

Koji Arafune et al., Directional Solidification of Polycrystalline Silicon Ingots by Successive Relaxation of Supercooling Method, Journal of Crystal Growth, Oct. 1, 2007, pp. 5-9, vol. 308.

* cited by examiner

*Primary Examiner* — David Nhu
(74) *Attorney, Agent, or Firm* — Philip O. Post

(57) ABSTRACT

An apparatus and process are provided for directional solidification of silicon by electric induction susceptor heating in a controlled environment. A susceptor vessel is positioned between upper and lower susceptor induction heating systems and a surrounding induction coil system in the controlled environment. Alternating current selectively applied to induction coils associated with the upper and lower susceptor heating systems, and the induction coils making up the surrounding induction coil system, result in melting of the silicon charge in the vessel and subsequent directional solidification of the molten silicon. A fluid medium can be directed from below the vessel towards the bottom, and then up the exterior sides of the vessel to enhance the directional solidification process.

11 Claims, 3 Drawing Sheets

DIRECTIONAL SOLIDIFICATION OF SILICON BY ELECTRIC INDUCTION SUSCEPTOR HEATING IN A CONTROLLED ENVIRONMENT

CROSS REFERENCE TO RELATED APPLICATIONS

This application claims the benefit of U.S. Provisional Application No. 60/093,347, filed Aug. 31, 2008, which is hereby incorporated by reference in its entirety.

FIELD OF THE INVENTION

The present invention relates to directional solidification of silicon by electric induction heating in a controlled environment.

BACKGROUND OF THE INVENTION

Pure silicon does not exist in nature. Various methods can be used to remove the impurities from silicon ore. Some methods involve heating and melting the silicon so that impurities are driven out of the molten silicon by outgassing or sedimentation. Outgassing is enhanced in a controlled vacuum environment. Methods of heating and melting silicon ore must take into consideration the fact that silicon is essentially non-electrically conductive in the solid state, and electrically conductive in the molten state.

It is one object of the present invention to provide a method of purifying silicon by heating and melting a charge of impure solid silicon in a controlled environment by inductively heating multiple susceptor elements surrounding a crucible containing solid silicon.

BRIEF SUMMARY OF THE INVENTION

The present invention is in one aspect, apparatus for, and method of, heating and melting a charge of impure silicon and directionally solidifying the molten silicon in a controlled environment such as a vacuum chamber, or a chamber having an inert gas environment. Silicon in suitable solid form is placed in a susceptor vessel and load into the chamber. The susceptor vessel is positioned between upper and lower susceptor heating systems and an exterior surrounding induction coil system in the controlled environment. Alternating current selectively applied to induction coils associated with the upper and lower susceptor heating systems, and the induction coils making up the surrounding induction coil system, result in melting of the silicon charge in the vessel and subsequent directional solidification of the molten silicon. A fluid medium can be directed from below the vessel towards the bottom, and up the exterior of the wall of the vessel to enhance the directional solidification process.

The above and other aspects of the invention are set forth in this specification and the appended claims.

BRIEF DESCRIPTION OF THE DRAWINGS

The foregoing brief summary, as well as the following detailed description of the invention, is better understood when read in conjunction with the appended drawings. For the purpose of illustrating the invention, there is shown in the drawings exemplary forms of the invention that are presently preferred; however, the invention is not limited to the specific arrangements and instrumentalities disclosed in the following appended drawings.

DETAILED DESCRIPTION OF THE INVENTION

Figure 1:
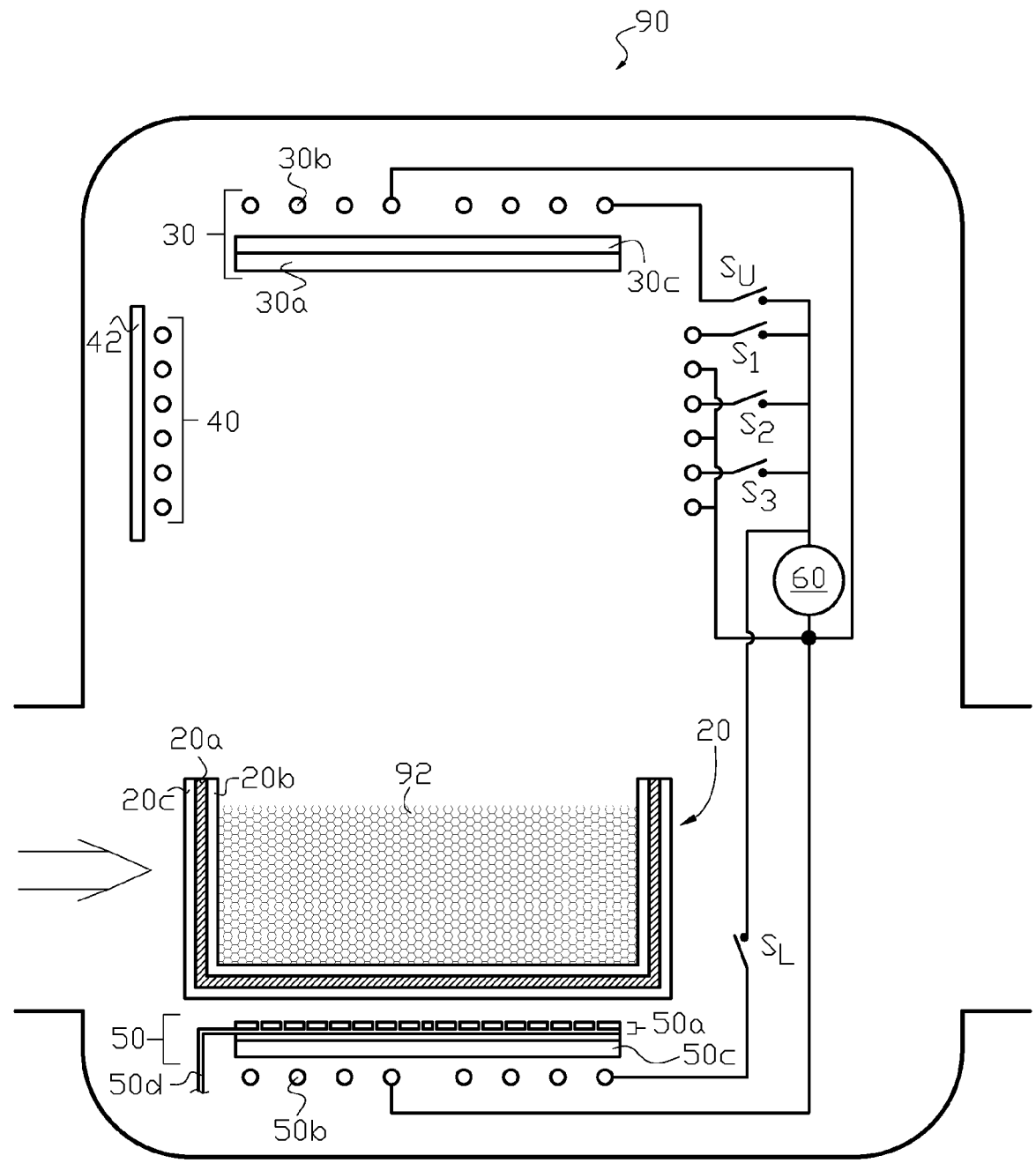
FIG. 1 is a cross sectional view of one example of the present invention with a susceptor vessel containing silicon charge loaded into a controlled environment chamber.

There is shown in the figures one non-limiting example of the apparatus and process of present invention. Controlled environment chamber 90 contains upper susceptor heating system 30, vessel surrounding induction coil system 40, and lower susceptor heating system 50. Susceptor vessel 20 can be filled with impure silicon charge 92 and loaded into chamber 90 with a suitable mechanical transport system.

Susceptor vessel 20 may comprise susceptor 20a, formed, for example, from a graphite composition, which can be physically isolated from silicon 92 by a protective liner material 20b, such as quartz, to prevent contamination of the molten silicon in the vessel with the graphite composition. Alternatively the graphite composition may be treated to inhibit reaction with the silicon charge. The silicon charge in the susceptor vessel, which is initially in the solid non-electrically conductive state, is heated and melted to separate impurities from the silicon, and directionally solidified as purified silicon, as described below. The solid silicon may be in any form, for example, silicon pellets or crushed silicon compositions. Thermal insulation 20c can be provided around the exterior of susceptor 20a to direct heat induced in the susceptor into the mass of silicon 92 in vessel 20, and to protect induction coil system 40 from heat generated in the susceptor. In alternative examples of the invention the thermal insulation may be, at least in part provided around the interior of surrounding induction coil system 40 rather than integral with susceptor vessel 20. In some examples of the invention, a susceptor may not be used in the bottom region of the vessel, or the bottom susceptor region may be formed from segmented one or more susceptors.

Figure 4:
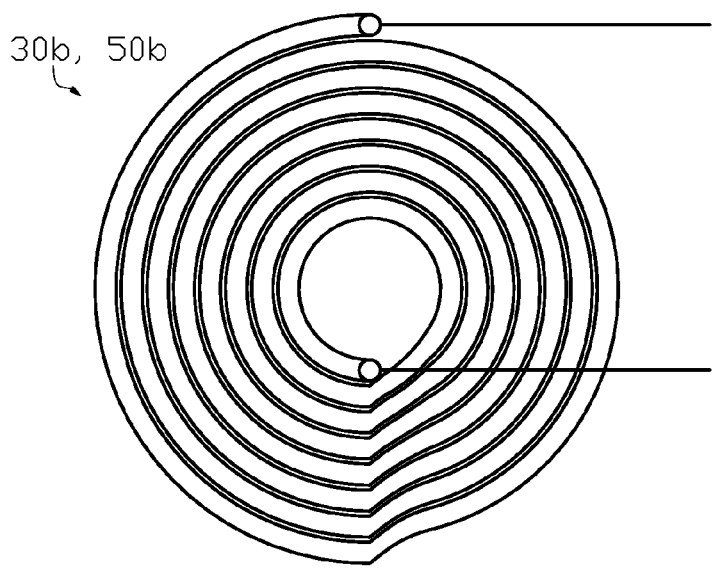
FIG. 4 is one example of an induction coil used in the upper or lower susceptor heating system of the present invention.

Upper susceptor induction heating system 30 comprises upper susceptor 30a with upper induction coil 30b positioned adjacent to susceptor 30a. Coil 30b may be configured as a "pancake" type coil, as shown for example in FIG. 4, suitably arranged over susceptor 30a to achieve a desired heat distribution profile in the mass of susceptor 30a. High temperature thermal insulation 30c can be provided to direct heat to silicon 92 in vessel 20, as further described below, and to protect induction coil 30b from heat generated in the susceptor. A suitable high temperature thermal insulation is CALCARB® insulation material available from Calcarb Ltd (Bellshill, Scotland, UK).

Figure 3:
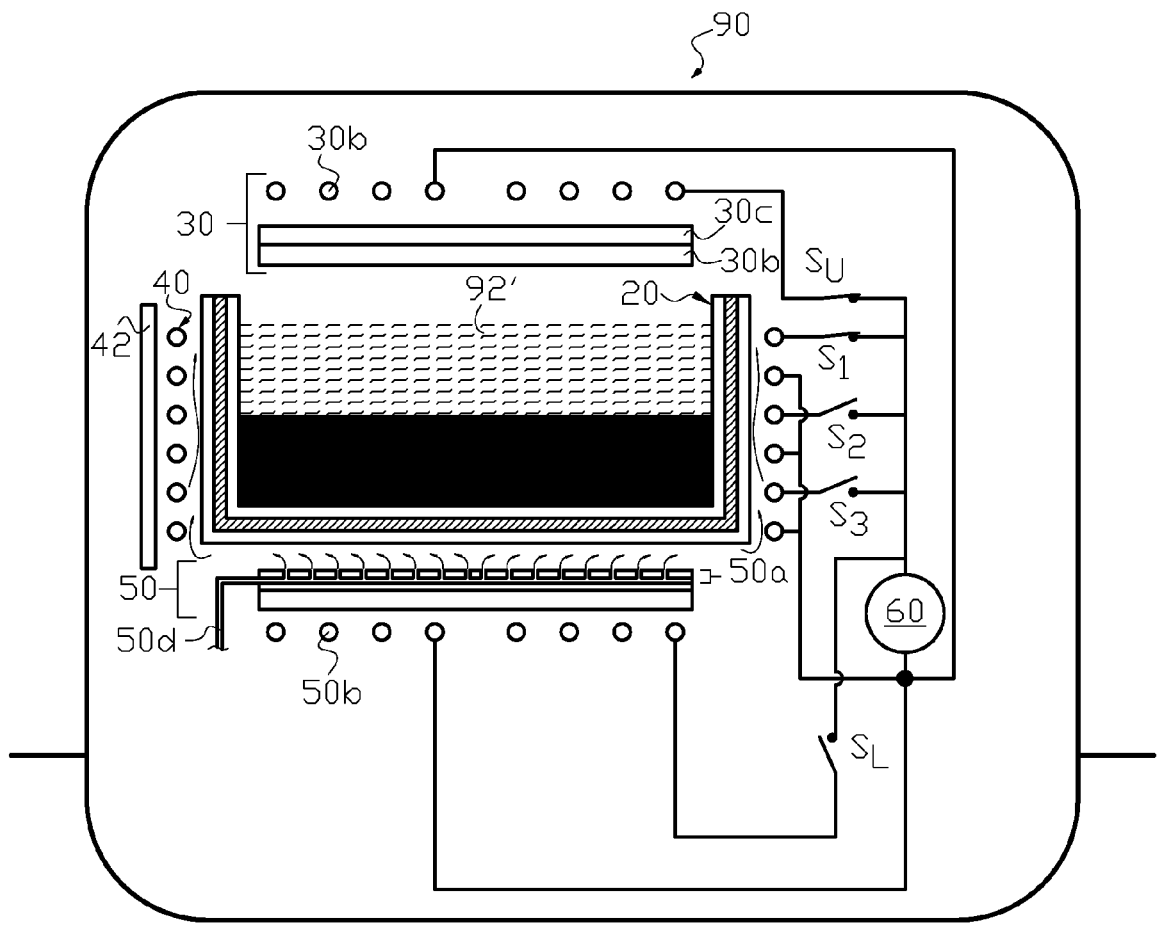
FIG. 3 is a cross sectional view of one example of the present invention with directional solidification of the silicon in the susceptor vessel partially completed.

Lower susceptor induction heating system 50 comprises susceptor 50a with lower induction coil 50b positioned adjacent to susceptor 50a. Coil 50b may be configured as a "pancake" type coil suitably arranged under susceptor 50a to achieve a desired heat distribution profile in the mass of susceptor 50a. High temperature thermal insulation 50c can be provided to direct heat to the bottom of the mass of silicon 92 in vessel 20, as further described below, and to protect induction coil 50b from heat generated in the susceptor. A suitable cooling medium, for example air or other gaseous composition, can be supplied to cooling conduit 50d, as further described below, to flow through passages in lower susceptor 50a and up along the exterior sides of vessel as illustrated by representative air flow arrows in FIG. 3 where the silicon mass is shown in half molten state 92' and half solid (purified) state (shown in solid black).

Upper induction coil 30b, surrounding induction coil system 40 and lower induction coil 50b are suitably connected to one or more alternating current (ac) power supplies, such as power supply 60 in the figures. Although the upper and lower induction coils are represented as a single coil, any number of coils, and arrangements thereof, may be used in other examples of the invention. Although the surrounding induction coil system 40 is represented as three helical coils surrounding the exterior wall of the susceptor vessel, any number of coils, and arrangements thereof, may be used to in other examples of the invention. Suitable switching devices $S_1$ through $S_3$ are used to control power (current flow) through each of the surrounding induction coils; suitable switching devices $S_U$ and $S_L$ are used to control current flow through the upper and lower induction coils, respectively. The one or more power supplies may output fixed or variable frequencies and/or power levels as required during a particular induction heating process. Electromagnetic shunts 42 may be used around the exterior of the surrounding induction coil system to direct the magnetic flux fields towards the susceptor vessel.

Figure 2:
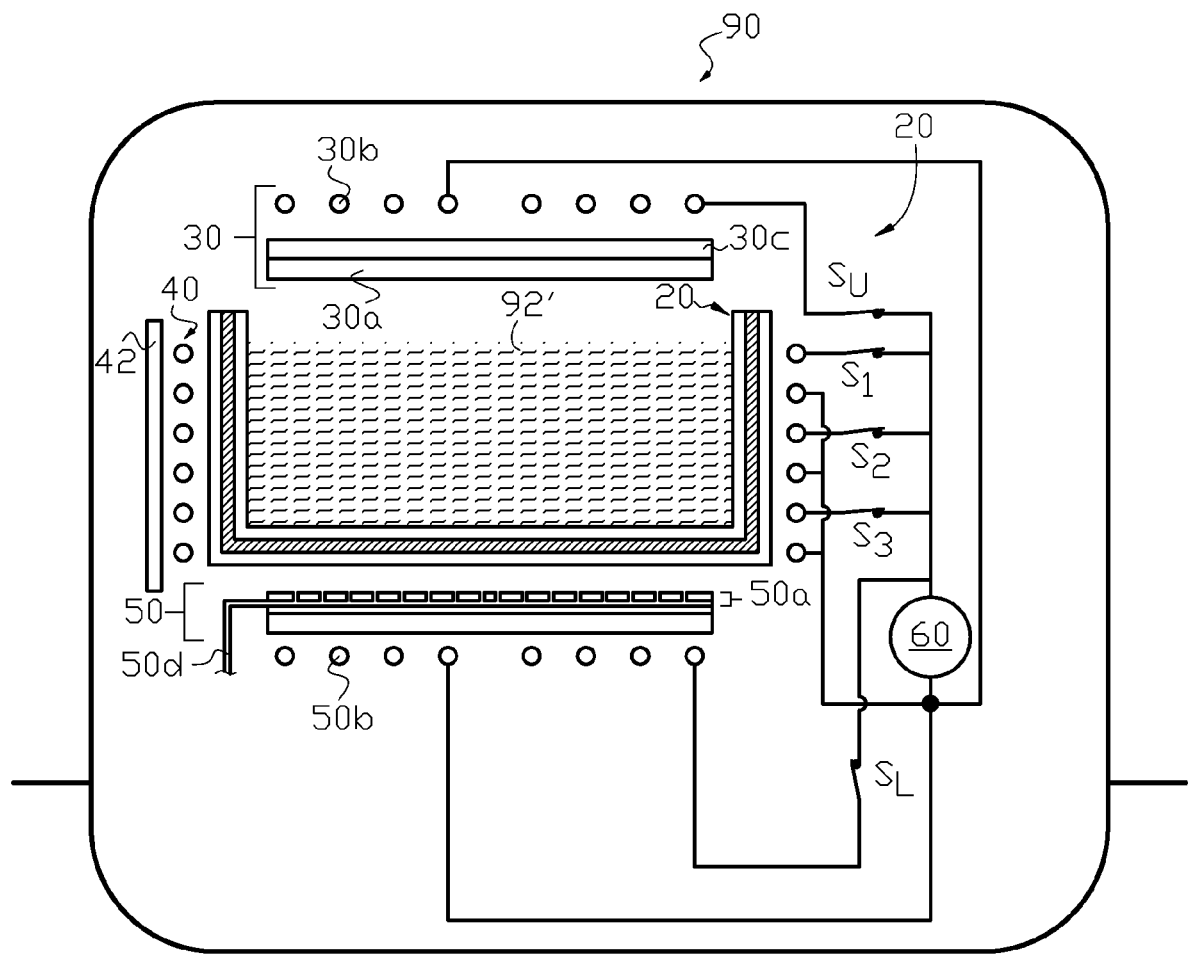
FIG. 2 is a cross sectional view of one example of the present invention with the susceptor vessel positioned inside the controlled environment chamber for melting of the silicon charge and directional solidification.

In FIG. 1 susceptor vessel 20, which is loaded into chamber 90 can be seated upon a suitable support platform (not shown in the figures) formed from a material composition having a high value of thermal conductivity or otherwise configured (for example, with a plurality of holes or passages) to facilitate heat transfer from the inductively heated lower susceptor 50a to the bottom of vessel 20 when positioned as shown in FIG. 2.

A suitable vertical translation drive system (not shown in the figures) can be used to raise susceptor vessel 20 and lower susceptor induction heating system 50 to the position shown in FIG. 2 where silicon is shown in molten state 92' so that the vessel is located within surrounding induction coil system 40 and chamber 90 is closed to the external environment. Alternatively in other examples of the invention, the upper susceptor induction heating system 30 and surrounding induction coil system 40 can be lowered so that the vessel is located within surrounding induction coil system 40 and chamber 90 is closed to the external environment.

With susceptor vessel 20 positioned as shown in FIG. 2 heating and melting of silicon 92' in the vessel can be accomplished by closing switches $S_U$, $S_L$, $S_1$, $S_2$ and $S_3$ to inductively heat the upper and lower susceptors, and the susceptor vessel, so that heat from the susceptors transfers by radiation to silicon 92 in the vessel. Current flows through the upper and lower induction coils, and the coils making up the surrounding induction coil system generate magnetic flux fields that couple with the associated susceptors to inductively heat them. Depending upon the frequency of the current and configuration of the susceptors, some flux may penetrate the susceptors and inductively couple with the silicon in the vessel once it becomes electrically conductive. In some examples of the invention power supply 60 may have a variable frequency output that is adjusted to increase magnetic coupling within the susceptor vessel as the silicon transfers to the molten state.

After the mass of silicon in the vessel is melted, the switches are selectively opened to facilitate directional solidification of the molten silicon in the vessel from the bottom upwards. For example, switching device $S_L$ may be opened first, followed sequentially by switching devices $S_3$, $S_2$, $S_1$ and $S_U$ as the directional solidification process progresses. Further a suitable cooling medium, for example air or other gaseous medium, can be supplied to cooling conduit 50d, as further described above, to flow through passages in the lower susceptor and up along the exterior sides of the vessel as illustrated by representative air flow arrows in FIG. 3, which illustrates partial directional solidification (shown in solid black) of purified silicon in the susceptor vessel.

In alternative examples of the invention the susceptor vessel may be gradually withdrawn from within the surrounding induction coil system to enhance the directional solidification process while the cooling medium is supplied from below the vessel.

The present invention has been described in terms of preferred examples and embodiments. Equivalents, alternatives and modifications, aside from those expressly stated, are possible and within the scope of the invention.

The invention claimed is:

1. A controlled environment electric induction silicon melter and directional solidification apparatus comprising:
a controlled environment chamber;
an upper susceptor heating system comprising at least one upper induction coil and an upper susceptor heating element, the at least one upper induction coil arranged to inductively heat the upper susceptor heating element when a first alternating current flows through the at least one upper induction coil, the upper susceptor heating element arranged to heat by radiation an upper surface volume of impure silicon placed in a susceptor vessel in the controlled environment chamber, the susceptor vessel having at least a wall formed from a susceptor material;
a susceptor vessel heating system comprising at least one vessel induction coil arranged to surround the exterior of the wall of the susceptor vessel and inductively heat the wall of the susceptor vessel when a second alternating current flows through the at least one vessel induction coil;
a lower susceptor heating system comprising at least one lower induction coil and a lower susceptor heating element, the at least one lower induction coil arranged to inductively heat the lower susceptor heating element when a third alternating current flows through the at least one lower induction coil, the lower susceptor heating element arranged to heat by radiation at least the bottom of the susceptor vessel;
at least one alternating current power source for supply of the first, second and third alternating currents;
a plurality of switching elements for controlling supply of the first, second and third alternating currents to the at least one upper induction coil, the at least one vessel induction coil, and the at least one lower induction coil;
a chamber open and close apparatus for entry and removal of the susceptor vessel from the controlled environment chamber; and
a chamber translation system for moving at least the susceptor vessel and at least one of the: upper susceptor heating system; the lower susceptor heating system; or the susceptor vessel heating system to position the susceptor vessel within the susceptor vessel heating system and between the upper and lower susceptor heating systems.

2. The directional solidification apparatus of claim 1 further comprising a thermal insulation between the at least one upper induction coil and the upper susceptor heating element, the thermal insulation arranged to direct radiant heat from the upper susceptor heating element towards the volume of impure silicon in the susceptor vessel.

3. The directional solidification apparatus of claim 1 further comprising a thermal insulation between the at least one lower induction coil and the lower susceptor heating element, the thermal insulation arranged to direct radiant heat from the lower susceptor heating element towards the bottom of the susceptor vessel.

4. The directional solidification apparatus of claim 1 further comprising a fluid medium cooling system comprising a supply of a fluid cooling medium, a plurality of fluid medium passages for routing the fluid cooling medium upwards through the lower susceptor heating element towards the bottom of the susceptor vessel, and then up along an exterior region of the wall of the susceptor vessel.

5. The directional solidification apparatus of claim 1 further comprising an arrangement of electromagnetic shunts arranged around the exterior of the at least one vessel induction coil to direct the magnetic flux towards the wall of the susceptor vessel.

6. The directional solidification apparatus of claim 1 wherein the at least one alternating current power source comprises a variable frequency output power supply.

7. A method of directionally solidifying molten silicon in a controlled environment, the method comprising:
inserting an open top susceptor vessel containing a charge of impure silicon in a controlled environment chamber;
positioning the open top susceptor vessel within a susceptor vessel induction heating system and between an upper and a lower susceptor heating systems;
supplying an alternating current to at least one induction coil in each of the susceptor vessel induction heating system, the upper susceptor heating system and the lower susceptor heating system, the at least one induction coil in the susceptor vessel induction heating system inductively heating at least the wall of the susceptor vessel, the at least one induction coil in the upper susceptor heating system inductively heating an upper susceptor to radiantly melt an upper volume of charge of impure silicon in the open top susceptor vessel, and the at least one induction coil in the lower susceptor heating system inductively heating a lower susceptor to radiantly melt the lower volume of charge of impure metal in the open top susceptor vessel to produce a molten charge within the susceptor vessel; and
sequentially removing the alternating current from the at least one induction coil in the lower susceptor heating system, the susceptor vessel induction heating system and the upper susceptor heating system to directionally solidify the molten charge from the bottom to the top of the open top susceptor vessel.

8. The method of claim 7 further comprising passing a fluid cooling medium through the lower susceptor towards the bottom of the open top susceptor vessel and further directing the fluid cooling medium upwards along the exterior of the wall of the open top susceptor vessel.

9. The method of claim 7 wherein supplying the alternating current to the at least one induction coil in the susceptor vessel induction heating system further comprises altering the frequency of the current to control the degree of flux penetration into the open top susceptor vessel for magnetic coupling with the molten charge in the open top susceptor vessel.

10. A controlled environment electric induction silicon melter and directional solidification apparatus comprising:
a controlled environment chamber;
an upper susceptor heating system comprising at least one upper induction coil and an upper susceptor heating element, the at least one upper induction coil arranged to inductively heat the upper susceptor heating element when a first alternating current flows through the at least one upper induction coil, the upper susceptor heating element arranged to heat by radiation an upper surface volume of impure silicon placed in a susceptor vessel in the controlled environment chamber, the susceptor vessel having at least a wall formed from a susceptor material;
a thermal insulation between the at least one upper induction coil and the upper susceptor heating element, the thermal insulation arranged to direct radiant heat from the upper susceptor heating element towards the volume of impure silicon in the susceptor vessel;
a susceptor vessel heating system comprising at least one vessel induction coil arranged to surround the exterior of the wall of the susceptor vessel and inductively heat the wall of the susceptor vessel when a second alternating current flows through the at least one vessel induction coil;
a lower susceptor heating system comprising at least one lower induction coil and a lower susceptor heating element, the at least one lower induction coil arranged to inductively heat the lower susceptor heating element when a third alternating current flows through the at least one lower induction coil, the lower susceptor heating element arranged to heat by radiation at least the bottom of the susceptor vessel;
a thermal insulation between the at least one lower induction coil and the lower susceptor heating element, the thermal insulation arranged to direct radiant heat from the lower susceptor heating element towards the bottom of the susceptor vessel;
at least one alternating current power source for supply of the first, second and third alternating currents;
a plurality of switching elements for controlling supply of the first, second and third alternating currents to the at least one upper induction coil, the at least one vessel induction coil, and the at least one lower induction coil;
a fluid medium cooling system comprising a supply of a fluid cooling medium, a plurality of fluid medium passages for routing the fluid cooling medium upwards through the lower susceptor heating element towards the bottom of the susceptor vessel, and then up along an exterior region of the wall of the susceptor vessel;
a chamber open and close apparatus for entry and removal of the susceptor vessel from the controlled environment chamber; and
a chamber translation system for moving at least the susceptor vessel and at least one of the: upper susceptor heating system; the lower susceptor heating system; or the susceptor vessel heating system to position the susceptor vessel within the susceptor vessel heating system and between the upper and lower susceptor heating systems.

11. The directional solidification apparatus of claim 10 wherein the at least one alternating current power source comprises a variable frequency output power supply.

* * * * *